US012791688B2

(12) United States Patent
Han et al.

(10) Patent No.: US 12,791,688 B2
(45) Date of Patent: Nov. 10, 2026

(54) APPARATUS FOR MANUFACTURING LIDAR RECEIVER AND METHOD FOR MANUFACTURING LIDAR RECEIVER

(71) Applicant: HL KLEMOVE CORP., Incheon (KR)

(72) Inventors: Yun Ki Han, Gyeonggi-do (KR); HoSeok Shin, Gyeonggi-do (KR); HakGu Han, Gyeonggi-do (KR); Yong Min Park, Gyeonggi-do (KR); Hyuk Ryu, Seoul (KR)

(73) Assignee: HL KLEMOVE CORP., Incheon (KR)

( * ) Notice: Subject to any disclaimer, the term of this patent is extended or adjusted under 35 U.S.C. 154(b) by 1013 days.

(21) Appl. No.: 18/073,695

(22) Filed: Dec. 2, 2022

(65) Prior Publication Data

US 2023/0176202 A1 Jun. 8, 2023

(30) Foreign Application Priority Data

Dec. 2, 2021 (KR) ........................ 10-2021-0170866

(51) Int. Cl.
*G01S 7/497* (2006.01)
*G01S 7/481* (2006.01)
*H01S 5/02375* (2021.01)

(52) U.S. Cl.
CPC .......... *G01S 7/4972* (2013.01); *G01S 7/4813* (2013.01); *H01S 5/02375* (2021.01)

(58) Field of Classification Search
CPC ...... G01S 7/4972; G01S 7/4816; B23P 21/00; H01S 5/02375
See application file for complete search history.

(56) References Cited

U.S. PATENT DOCUMENTS

2015/0174715 A1* 6/2015 Kang ...................... B23P 19/04 29/714
2021/0199774 A1 7/2021 Pan et al.
(Continued)

FOREIGN PATENT DOCUMENTS

CN 109375234 2/2019
CN 111780782 10/2020
CN 111780782 A * 10/2020 ............. G01C 25/00

OTHER PUBLICATIONS

Office Action dated Jun. 28, 2025 for Chinese Patent Application No. 202211534107.5 and its English translation from Global Dossier.

*Primary Examiner* — Yuqing Xiao
*Assistant Examiner* — Chia-Ling Chen
(74) *Attorney, Agent, or Firm* — WOMBLE BOND DICKINSON (US) LLP

(57) ABSTRACT

Provided are an apparatus for manufacturing a light detection and ranging (LiDAR) receiver and a method of manufacturing a LiDAR receiver. In the apparatus for manufacturing a LiDAR receiver according to one embodiment of the present disclosure, a receiver board is coupled integrally to a barrel having one side provided with a lens after the receiver board having one side on which a light detection element is mounted is aligned with the other side of the barrel, and the apparatus includes a base plate having a plate shape, a light source unit, and a receiver alignment unit, wherein the light source unit may include a light-emitting module and a light-emitting module fixing member, and the receiver alignment unit may include an alignment plate having a plate shape, a barrel fixing member, a receiver board fixing member, and a receiver board alignment member.

19 Claims, 13 Drawing Sheets

(56) References Cited

U.S. PATENT DOCUMENTS

| | | | | |
|---|---|---|---|---|
| 2022/0018947 | A1* | 1/2022 | Wang | G01S 7/4812 |
| 2023/0139114 | A1* | 5/2023 | Farmer | H01S 5/02375<br>257/99 |
| 2024/0241236 | A1* | 7/2024 | Weiss | G01S 7/4972 |

* cited by examiner

APPARATUS FOR MANUFACTURING LIDAR RECEIVER AND METHOD FOR MANUFACTURING LIDAR RECEIVER

CROSS-REFERENCE TO RELATED APPLICATION

This application claims priority to and the benefit of Korean Patent Application No. 10-2021-0170866, filed on Dec. 2, 2021, the disclosure of which is incorporated herein by reference in its entirety.

BACKGROUND

1. Technical Field

The present disclosure relates to an apparatus for manufacturing a light detection and ranging (LiDAR) receiver and a method of manufacturing a LiDAR receiver, and more particularly, to an apparatus for manufacturing a LiDAR receiver which is capable of aligning and integrally forming a receiver board and a barrel, and a method of manufacturing a LiDAR receiver.

2. Discussion of Related Art

In general, a light detection and ranging (LiDAR) sensor emits laser pulses and receives light reflected from nearby target objects to measure distances to the objects and draw a precise image of its surroundings.

Unlike radars which emit electromagnetic waves to the outside and check a distance, a direction, or the like with electromagnetic waves that are re-received, a LiDAR sensor emits a pulse laser. That is, since a laser having a short wavelength is used, there is an advantage in that precision and resolution are high and even three-dimensional recognition is possible for some objects.

Recently, as vehicles have become more highly intellectualized, LiDAR sensors have been used to collect information about terrain features outside of a vehicle. In particular, in order to more accurately collect information about external terrain features, LiDAR sensors designed to have a wide viewing angle are widely used.

To this end, a LiDAR sensor generally has an optical system structure in which a laser output from a high-power laser diode is condensed into parallel light through a collimation lens and a light detection element is positioned at a focal length through a condensing lens. In such a LiDAR sensor, a fine optical aligning operation of an optical system is also necessarily included.

In this case, a LiDAR sensor used in a vehicle has a problem in that optical alignment may be distorted due to vibration or shock generated during driving of the vehicle, and when the optical alignment is distorted, sensing precision or resolution is degraded. Therefore, a structure capable of correcting distortion in optical alignment that occurs in the conventional LiDAR sensor is provided.

However, such a structure has a problem in that it is difficult to reflect a recent trend of minimizing a size of a LiDAR sensor, which is inevitably disposed outside a vehicle, to reduce air resistance during driving of a vehicle without sacrificing an appearance of the vehicle.

Meanwhile, there is a need to check a viewing angle of a LiDAR sensor for optical alignment of the LiDAR sensor. To this end, conventionally, it has been checked whether a light detection element of a LiDAR sensor can smoothly detect light by securing a viewing angle region that can actually be detected by the LiDAR sensor.

However, as the viewing angles of LiDAR sensors have recently been widened, a problem in which a wider space should be secured in order to check the viewing angle of a LiDAR sensor has arisen.

SUMMARY

The present disclosure is directed to providing an apparatus for manufacturing a light detection and ranging (LiDAR) receiver in which a receiver board and a lens are optically aligned with each other, thereby constantly maintaining optical alignment after a LiDAR sensor is manufactured, and a method of manufacturing a LiDAR receiver.

The present disclosure is also directed to providing an apparatus for manufacturing a LiDAR receiver in which a viewing angle of a LiDAR sensor may be checked even in a small space when the LiDAR sensor is manufactured, and a method of manufacturing a LiDAR receiver.

It should be noted that objects of the present disclosure are not limited to the above-described objects, and other objects which have not been described above will be clearly understood by those skilled in the art from the following descriptions.

According to an aspect of the present disclosure, there is provided an apparatus for manufacturing a LiDAR receiver in which a receiver board is coupled integrally to a barrel having one side provided with a lens after the receiver board having one side on which a light detection element is mounted is aligned with the other side of the barrel, the apparatus including a base plate having a plate shape of which a length extends rearward, a light source unit disposed at a rear side of an upper surface of the base plate, and a receiver alignment unit disposed to face the light source unit at a front side of the base plate, wherein the light source unit includes a light-emitting module including a light-emitting element configured to radiate light forward and a light-emitting module fixing member configured to fix the light-emitting module to the base plate, and a receiver alignment unit includes an alignment plate having a plate shape, a barrel fixing member configured to fix the barrel to a front side of the alignment plate, the receiver board fixing member configured to fix the receiver board to the alignment plate such that the receiver board is disposed at a rear side of the barrel, and a receiver board alignment member configured to couple the receiver board to the rear side of the barrel in a state in which the light reaches the light detection element to be perpendicular thereto.

The detection element may be provided as a plurality of detection elements.

The plurality of detection elements may be disposed in a line on one surface of the receiver board.

The barrel fixing member may fixe the barrel such that a length direction of the barrel is parallel to a length direction of the base plate.

The light source unit may further include a light-emitting module alignment member disposed between the light-emitting module fixing member and the base plate to control a movement path of the light of the light-emitting module, and the light-emitting module alignment member may control the movement path of the light to be shiftable along a first axis extending in a lateral direction.

The receiver board alignment member may further include a receiver board alignment member configured to connect the receiver board fixing member to the alignment plate and control the receiver board to be rotatable about a second axis extending in a vertical direction as a rotation axis.

The apparatus may further include a light-emitting module alignment member disposed between the light-emitting module fixing member and the base plate to control a movement path of the light of the light-emitting module, and the light-emitting module alignment member may control the movement path of the light to be rotatable about a first axis extending in a lateral direction to be parallel to the base plate.

The light source unit may further include a light-emitting module alignment member disposed between the light-emitting module fixing member and the base plate to control a movement path of the light of the light-emitting module, and the light-emitting module alignment member may control the movement path of the light to be shiftable along a third axis extending in a vertical direction.

The apparatus may further include a receiver board alignment member configured to connect the receiver board fixing member to the alignment plate and control the receiver board to be rotatable about a fourth axis extending in a lateral direction as a rotation axis.

The apparatus may further include a receiver board alignment member configured to connect the receiver board fixing member to the alignment plate and control the receiver board to be rotatable about a fifth axis extending in a front-rear direction as a rotation axis.

The apparatus may further include a receiver board alignment member configured to connect the receiver board fixing member to the alignment plate and control the receiver board to be movable along a fifth axis extending in a front-rear direction as a rotation axis.

The receiver alignment unit may further include an alignment plate alignment member configured to connect the alignment plate to the base plate and control the alignment plate to be rotatable about a sixth axis extending in a lateral direction as a rotation axis.

The receiver alignment unit may further include an alignment plate alignment member configured to connect the alignment plate to the base plate and control the alignment plate to be rotatable about a seventh axis extending in a vertical direction as a rotation axis.

The alignment plate alignment member may rotate about a center point of an optical stop area of the lens of the barrel.

According to another aspect of the present disclosure, there is provided a method of manufacturing a LiDAR receiver using an apparatus for manufacturing a LiDAR receiver, the method including a barrel fixing operation of fixing a barrel to a barrel fixing member disposed at one side of a base plate such that a lens faces rearward, a receiver board fixing operation of fixing a receiver board having one surface on which a plurality of light detection elements are disposed to a receiver board fixing member such that the plurality of light detection elements vertically disposed in a line on the receiver board fixing member disposed at a rear side of the barrel face the barrel, a light source aligning operation of aligning a light source such that light emitted from a light-emitting module including a light-emitting element travels toward the lens, a receiver aligning operation of aligning a movement path of the light such that the light reaches the light detection element to be perpendicular thereto, and a receiver coupling operation of coupling the receiver board to the rear side of the barrel.

In the barrel fixing operation, the barrel may be fixed to the barrel fixing member such that a length direction of the barrel is parallel to a length direction of the base plate.

The light source aligning operation may include a light-emitting module vertical aligning operation of, through a light-emitting module alignment member disposed between the base plate and a light-emitting module fixing member to which the light-emitting module is fixed, controlling the movement path of the light of the light-emitting module to be shiftable along an axis extending in a lateral direction to be parallel to the base plate or to be rotatable about the axis extending in the lateral direction, and a light-emitting module horizontal aligning operation of controlling the movement path of the light of the light-emitting module to be shifted along an axis extending in a vertical direction.

In the light-emitting module vertical aligning operation, the movement path of the light may be controlled and be rotated about the axis extending in the lateral direction to be parallel to the base plate through the light-emitting module alignment member.

The receiver aligning operation may include a barrel aligning operation of, through an alignment plate alignment member disposed between the base plate and an alignment plate to which the barrel fixing member is coupled, controlling the alignment plate to be rotatable about an axis extending in a lateral direction and an axis extending in a vertical direction as rotation axes such that an extending direction in which the barrel extends forward is parallel to a path of light radiated from the light-emitting element.

The receiver aligning operation may further include a receiver board aligning operation of, through a receiver board alignment member configured to connect the receiver board fixing member to the alignment plate, aligning the receiver board to align a movement path of the light radiated from the light-emitting element with the light detection element of the receiver board.

The receiver board aligning operation may include a receiver board vertical aligning operation of, through the receiver board alignment board, controlling the receiver board to be movable along the axis extending in the vertical direction or to be rotatable about the axis extending in the lateral direction or a front-rear direction, and a receiver board horizontal aligning operation of, through the receiver board alignment board, controlling the receiver board to be movable along the axis extending in the lateral direction or to be rotatable about the axis extending in the vertical direction.

The receiver board aligning operation may further include a focus aligning operation of, through the receiver board alignment member, controlling the receiver board to be movable along the axis extending in the front-rear direction.

The receiver aligning operation may further include a viewing angle checking operation of, through an alignment plate alignment member which controls an alignment plate to be rotatable, wherein the alignment plate supports the barrel fixing member to which the barrel is fixed and the receiver board fixing member to which the receiver board is fixed, checking whether the light reaches the light detection element in a state in which the movement path of the light is aligned.

In the viewing angle checking operation, the barrel may be controlled and rotated about a center point of an optical stop area of the lens of the barrel.

The viewing angle checking operation may include a vertical alignment checking operation of rotating the alignment plate about an axis extending in a lateral direction and checking whether the plurality of light detection elements detect the light, and a horizontal alignment checking operation of rotating the alignment plate about an axis extending in a vertical direction and checking whether intensities of light detected by the plurality of light sensing elements are symmetrical.

DETAILED DESCRIPTION OF EXEMPLARY EMBODIMENTS

Figure 1:
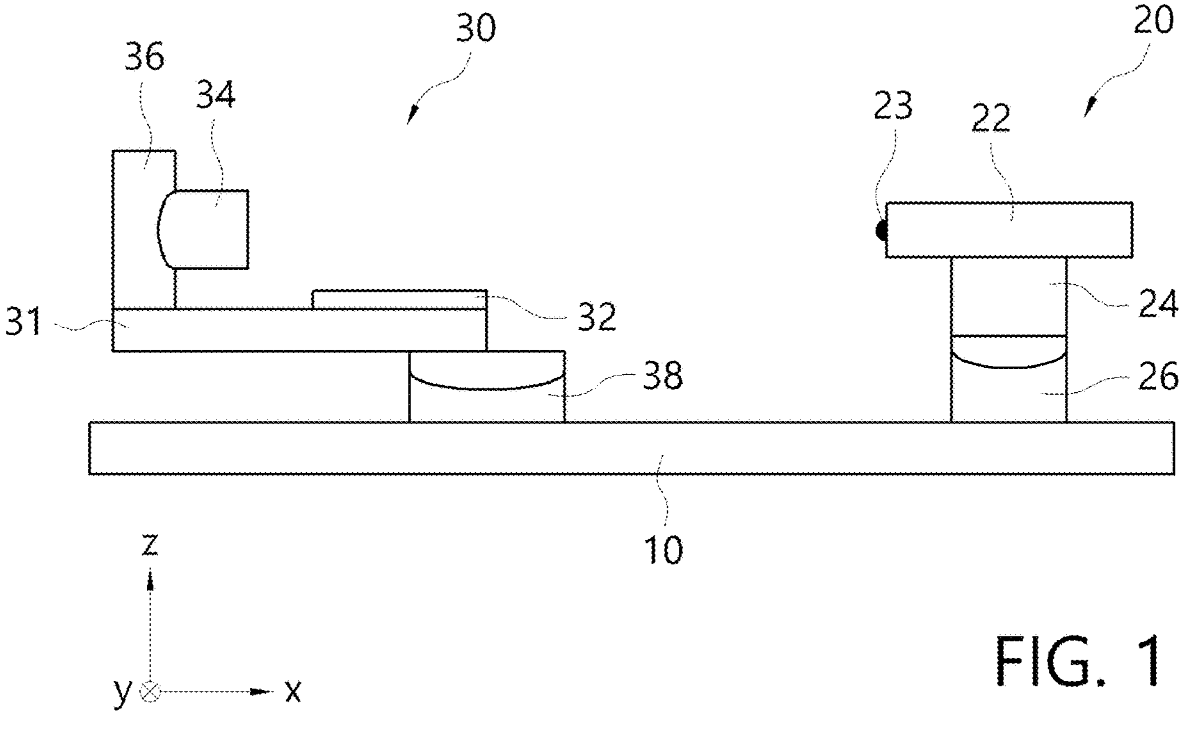
FIG. 1 is a side view illustrating an apparatus for manufacturing a light detection and ranging (LiDAR) receiver according to one embodiment of the present disclosure.

Hereinafter, embodiments of the present disclosure will be described in detail with reference to the accompanying drawings so as to be easily practiced by a person of ordinary skill in the art to which the present disclosure pertains. It should be understood that the present disclosure may be embodied in various different forms and is not limited to the following embodiments.

Parts irrelevant to description are omitted in the drawings in order to clearly describe the present disclosure, and like reference numerals refer to like elements throughout the specification. The terms used in the embodiments of the present disclosure have the same meanings as terms that are generally understood by those skilled in the art, as long as the terms are not explicitly defined differently.

In the following description of FIG. 1, an X-axis is defined as a rear direction, a Y-axis is defined as a right direction, and a Z-axis is defined as an upward direction. In the drawings, thicknesses or sizes are exaggerated in order to clearly express the characteristics of components, and thicknesses or sizes of the components shown in the drawings are not actual thicknesses or sizes.

Hereinafter, the expression "connected" or "attached" includes the meaning "directly connected" or "directly attached" as well as the meaning "indirectly connected" or "indirectly attached" through another component.

Terms such as "first" and "second" may be used to describe various components, but the components should not be limited by the terms. The terms may be used only for the purpose of distinguishing one component from another component. For example, without departing from the scope of the present disclosure, a first component may be referred to as a second component, and similarly, a second component may also be referred to as a first component.

Figure 2:
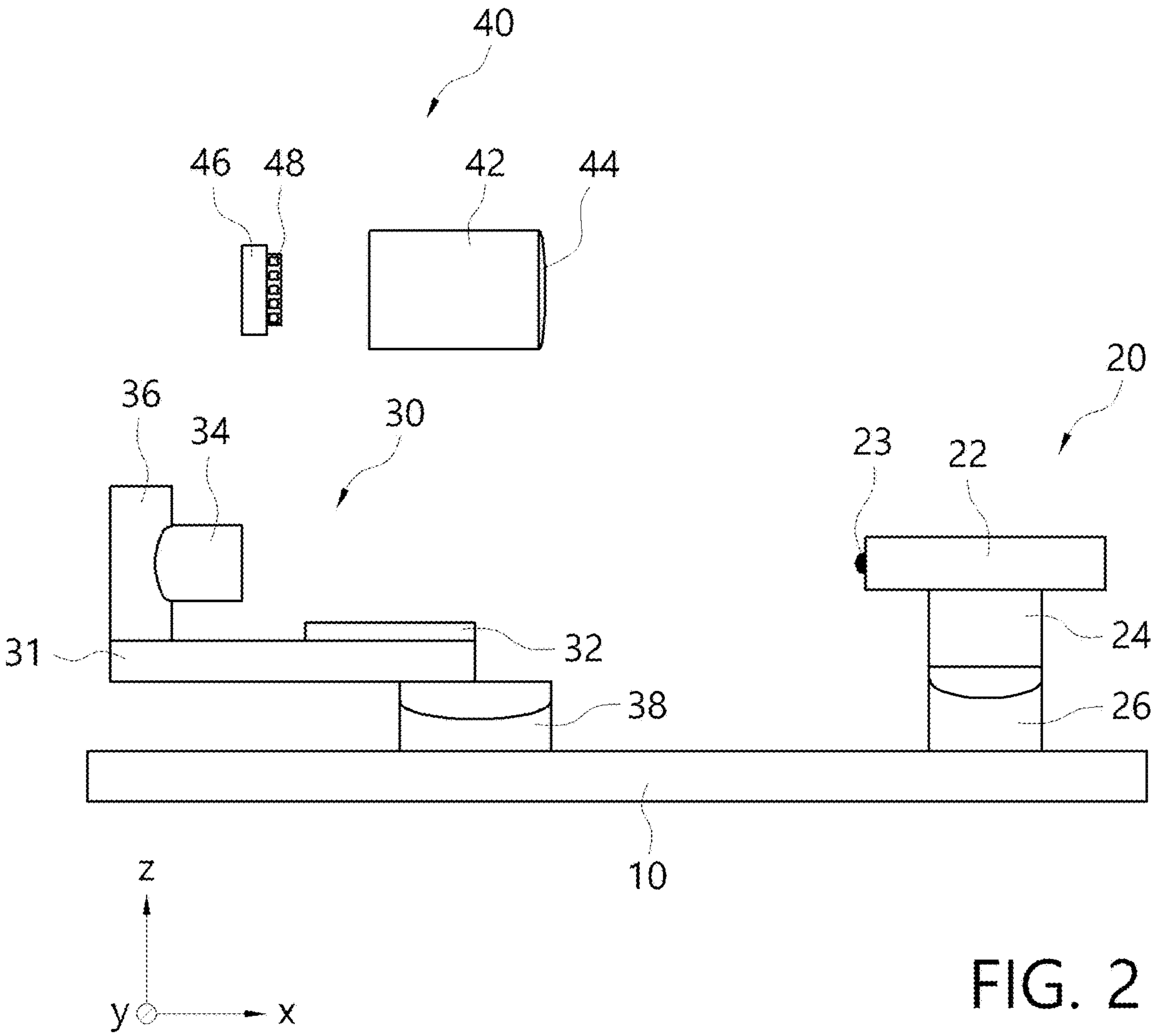
FIG. 2 is a side view illustrating an operation of fixing a receiver board and a barrel of the apparatus for manufacturing a LiDAR receiver according to one embodiment of the present disclosure.
Figure 3:
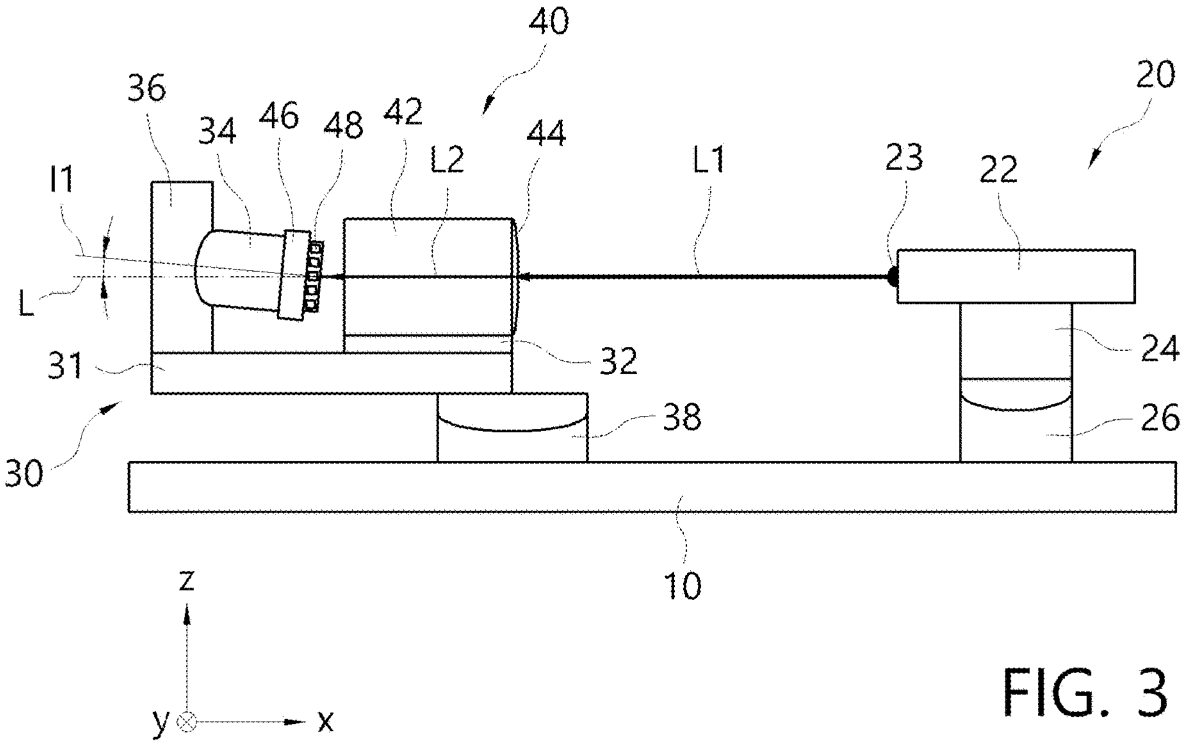
FIG. 3 is a side view illustrating an operation of vertically aligning the receiver board of the apparatus for manufacturing a LiDAR receiver according to one embodiment of the present disclosure.
Figure 4:
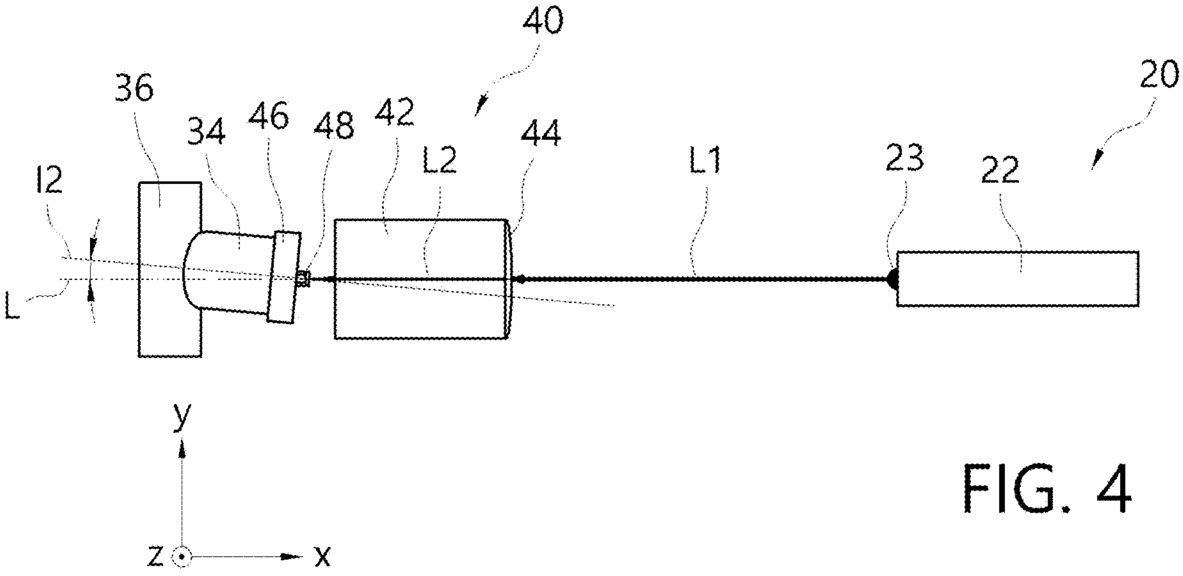
FIG. 4 is a top view illustrating an operation of horizontally aligning the receiver board of the apparatus for manufacturing a LiDAR receiver according to one embodiment of the present disclosure.
Figure 5:
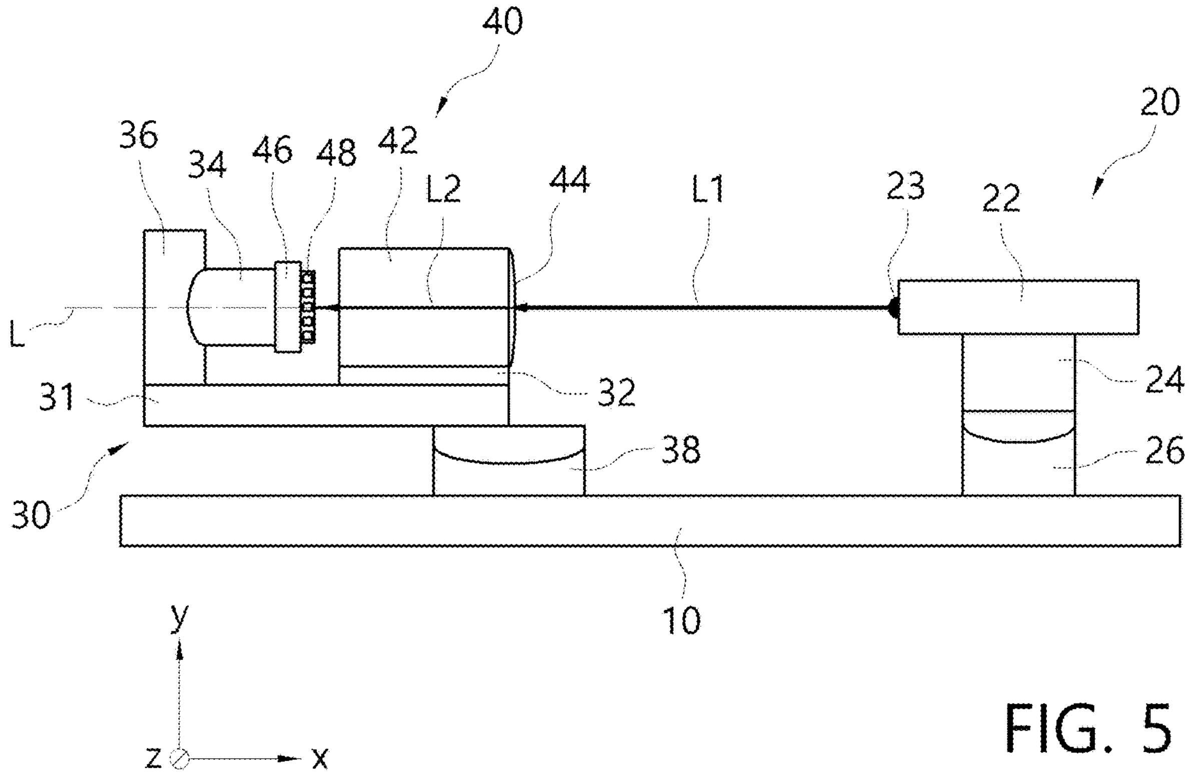
FIG. 5 is a side view illustrating an operation of aligning a focus of the apparatus for manufacturing a LiDAR receiver according to one embodiment of the present disclosure.
Figure 6:
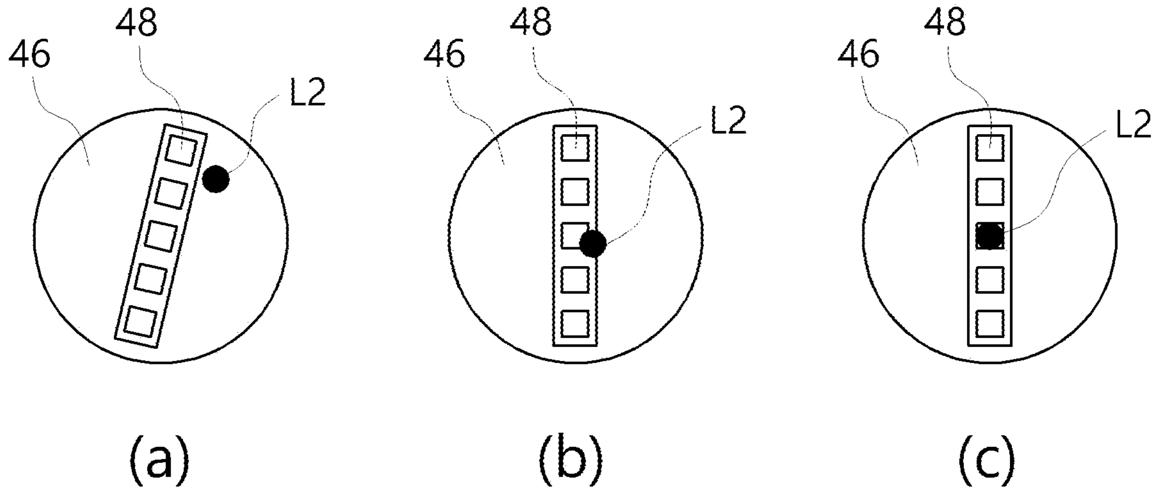
FIG. 6 is a view illustrating an operation of aligning the receiver board of the apparatus for manufacturing a LiDAR receiver according to one embodiment of the present disclosure.
Figure 7:
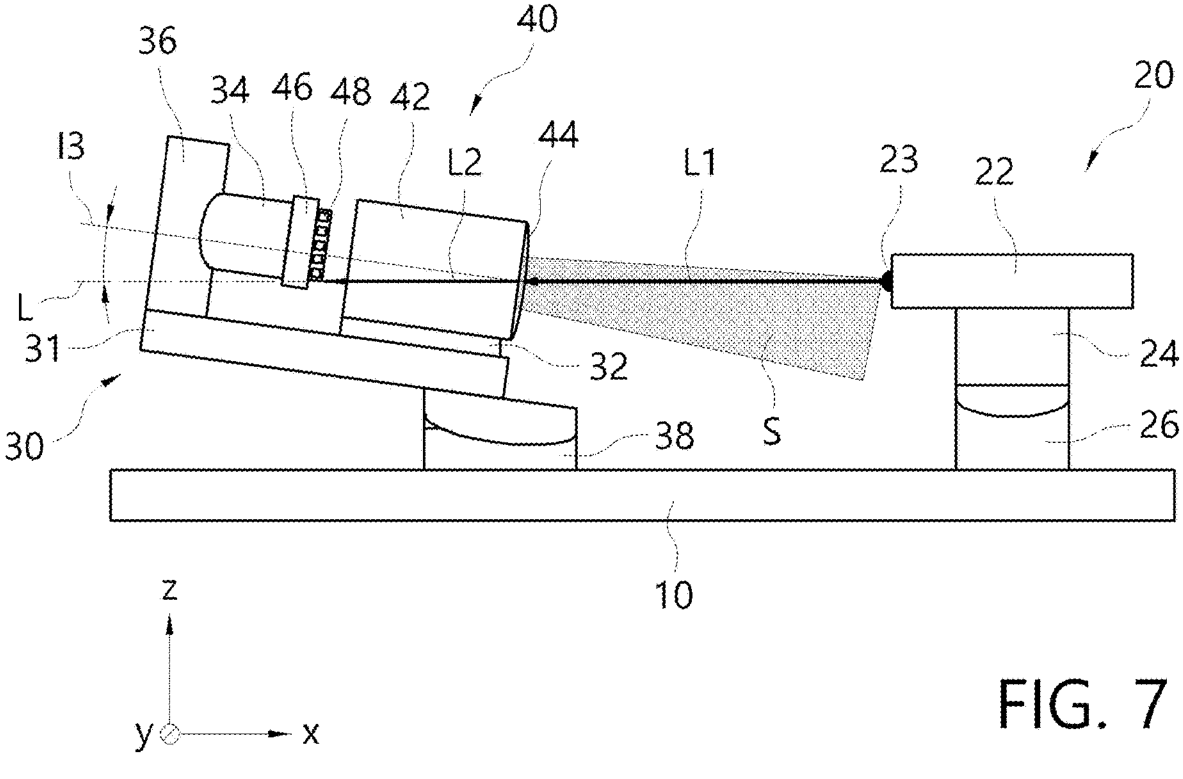
FIG. 7 is a side view illustrating an operation of checking vertical alignment of the apparatus for manufacturing a LiDAR receiver according to one embodiment of the present disclosure.
Figure 8:
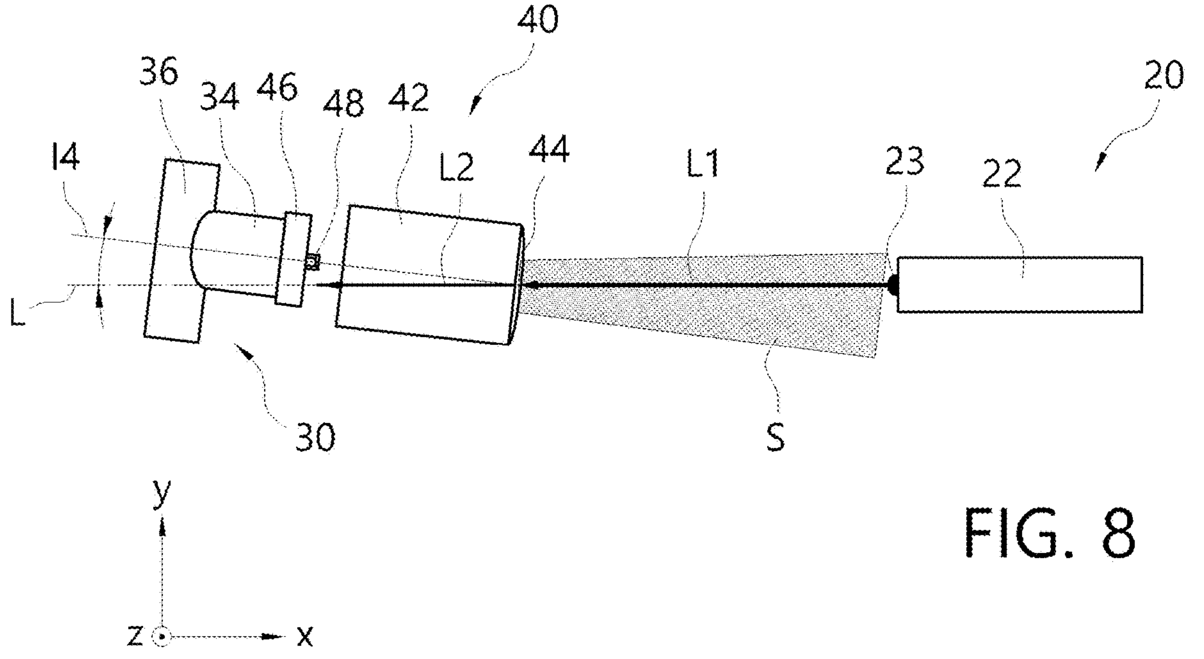
FIG. 8 is a top view illustrating an operation of checking horizontal alignment of the apparatus for manufacturing a LiDAR receiver according to one embodiment of the present disclosure.

FIG. 1 is a side view illustrating an apparatus for manufacturing a light detection and ranging (LiDAR) receiver according to one embodiment of the present disclosure. FIG. 2 is a side view illustrating an operation of fixing a receiver board and a barrel of the apparatus for manufacturing a LiDAR receiver according to one embodiment of the present disclosure. FIG. 3 is a side view illustrating an operation of vertically aligning the receiver board of the apparatus for manufacturing a LiDAR receiver according to one embodiment of the present disclosure. FIG. 4 is a top view illustrating an operation of horizontally aligning the receiver board of the apparatus for manufacturing a LiDAR receiver according to one embodiment of the present disclosure. FIG. 5 is a side view illustrating an operation of aligning a focus of the apparatus for manufacturing a LiDAR receiver according to one embodiment of the present disclosure. FIG. 6 is a side view illustrating an operation of aligning the receiver board of the apparatus for manufacturing a LiDAR receiver according to one embodiment of the present disclosure. FIG. 7 is a side view illustrating an operation of checking vertical alignment of the apparatus for manufacturing a LiDAR receiver according to one embodiment of the present disclosure. FIG. 8 is a top view illustrating an operation of checking horizontal alignment of the apparatus for manufacturing a LiDAR receiver according to one embodiment of the present disclosure.

The present disclosure relates to an apparatus for manufacturing a LiDAR receiver and a method of manufacturing a LiDAR receiver, and more particularly, to an apparatus for manufacturing a LiDAR receiver in which a receiver board 46 may be coupled integrally to a barrel 42 having one side provided with a lens 44 after the receiver board 46 in which a light detection element 48 is mounted as a part of LiDAR equipment on one surface thereof is aligned with the other side of the barrel 42, and a method of manufacturing a LiDAR receiver The present disclosure provides an apparatus for manufacturing a LiDAR receiver in which a receiver and a lens are fixed integrally to a barrel to be optically aligned with each other, thereby constantly maintaining optical alignment even after a LiDAR sensor is manufactured, and a structure in which the barrel including the lens and a receiver board are rotatable together is provided, so that a viewing angle of a LiDAR sensor can be checked even in a small space when the LiDAR sensor is manufactured, and a method of manufacturing a LiDAR receiver.

In this case, a LiDAR receiver manufactured in the present disclosure is a LiDAR receiver installed in a one-dimensional (1D) LiDAR. A plurality of light detection elements 48 of the LiDAR receiver are provided, and the plurality of light detection elements 48 are arranged in a line as shown in FIG. 6C. Descriptions will be provided assuming that a LiDAR manufactured in the present disclosure is a one-dimensional LiDAR.

Referring to FIG. 1, an apparatus 1 for manufacturing a LiDAR receiver according to one embodiment of the present disclosure includes a base plate 10, a light source unit 20, and a receiver alignment unit 30.

As shown in FIG. 1, the base plate 10 supports the light source unit 20 and the receiver alignment unit 30. The base plate 10 is formed in a plate shape that extends rearward such that the light source unit 20 and the receiver alignment unit 30 may be disposed at both end portions thereof. An extension length of the base plate 10 may be designed differently according to a rotation angle of an alignment plate alignment member 38 for aligning a viewing angle, which will be described below.

As shown in FIG. 3, the light source unit 20 supported by the base plate 10 is coupled to a rear end portion of the base plate 10. When a LiDAR receiver is manufactured, the light source unit 20 radiates light toward the LiDAR receiver for alignment between a light detection element 48 of a receiver board 46 and a barrel 42, which will be described below.

To this end, as shown in FIG. 1, the light source unit 20 of the apparatus 1 for manufacturing a LiDAR receiver according to one embodiment of the present disclosure includes a light-emitting module 22 and a light-emitting module fixing member 24.

As shown in FIG. 3, the light-emitting module 22 includes a light-emitting element 23 that emits light in a front direction in which the receiver board 46 and the barrel 42 are disposed. Light emitted by the light-emitting element 23 is not limited, and another light-emitting element 23 may be provided according to a wavelength applied to a LiDAR device in which a receiver is installed.

The light-emitting module 22 is fixed to the base plate 10 by the light-emitting module fixing member 24, and the light-emitting module fixing member 24 serves as a kind of mount to which the light-emitting module 22 may be coupled. Accordingly, even when an applied wavelength of the LiDAR receiver 40 that needs to be aligned is different, the light-emitting module 22 is replaced with a light-emitting module 22 for radiating light having a different wavelength, and the light-emitting module 22 for radiating light having a different wavelength is coupled to the light-emitting module fixing member 24, so that various LiDAR receivers can be manufactured using one apparatus 1 for manufacturing a LiDAR receiver.

As shown in FIG. 1, the light source unit 20 of the apparatus 1 for manufacturing a LiDAR receiver according to one embodiment of the present disclosure may further include a light-emitting module alignment member 26.

As shown in FIG. 1, the light-emitting module fixing member 24 may be fixed to the base plate 10 by the light-emitting module alignment member 26. While fixed to the light-emitting module fixing member 24, the light-emitting module 22 may be relatively aligned with the base plate 10 by the light-emitting module alignment member 26.

In order to optically align a LiDAR receiver using light emitted from the light-emitting element 23 of the light-emitting module 22, light radiated from the light-emitting element 23 should be radiated parallel to an upper surface of the base plate 10. In addition, light radiated from the light-emitting element 23 should be radiated onto the center of an optical stop area that determines an amount of light of the barrel 42 to be described below. Accordingly, a path of light radiated from the light-emitting module 22 is adjusted through the light-emitting module alignment member 26.

More specifically, the light-emitting module alignment member 26 may control the light-emitting module 22 to move in a lateral direction. In this case, in the description of the present specification, an axis that extends in a lateral direction and is a path along which the light-emitting module 22 moves will be defined as a first axis.

In addition, the light-emitting module alignment member 26 may control the light-emitting module 22 to rotate about the first axis as a rotation axis.

Furthermore, the light-emitting module alignment member 26 may control the light-emitting module 22 to move in a vertical direction. In this case, in the description of the present specification, an axis that extends in the vertical direction and is a path along which the light-emitting module 22 moves will be defined as a third axis.

As described above, the light-emitting module alignment member 26 controls the light-emitting module 22 to move linearly along the first and third axes, thereby controlling light L1 radiated from the light-emitting module 22 to reach the center of the optical stop area of the barrel 42. In addition, the light-emitting module alignment member 26 controls the light-emitting module 22 to rotate about the first axis as a rotation axis, thereby controlling light radiated from the light-emitting module 22 to be irradiated parallel to the upper surface of the base plate 10.

As shown in FIG. 2, the receiver alignment unit 30 is disposed to face the light source unit 20 at a side opposite to the light source unit 20. In the receiver alignment unit 30, the receiver board 46 and the barrel 42 constituting the LiDAR receiver are fixed and aligned. To this end, the receiver alignment unit 30 of the apparatus 1 for manufacturing a LiDAR receiver according to one embodiment of the present disclosure includes an alignment plate 31, a barrel fixing member 32, an alignment plate alignment member 38, a receiver board fixing member 34, and a receiver board alignment member 36.

As shown in FIG. 2, a shape of the alignment plate 31 is not limited as long as the alignment plate 31 can support the receiver board 46 and the barrel 42. In the present embodiment, the alignment plate 31 is formed in a plate shape. The barrel fixing member 32 is disposed at a rear end portion of the alignment plate 31 having the plate shape at a side of the light source unit 20 such that the barrel 42 may be fixed thereto.

As shown in FIG. 2, the barrel 42 coupled to the barrel fixing member 32 is formed in an elongated hollow barrel shape, a lens 44 for collecting light emitted from the light source unit 20 is disposed at one side thereof, and the receiver board 46 to be described below is coupled to the other side thereof. Accordingly, light collected through the lens 44 passes through the barrel 42 and travels to the light detection element 48 disposed on one surface of the receiver board 46.

In this case, the barrel fixing member 32 fixes the barrel 42 such that an extending direction of a length of the barrel 42 is parallel to an extending direction of a length of the base plate 10. As described above, in a case in which the barrel 42 is fixed, when light radiated from the light source unit 20 is radiated parallel to the extending direction of the base plate 10 by the light-emitting module alignment member 26, the extending direction of the barrel 42 and a path of light may be parallel to an X-Y plane.

In this case, as shown in FIG. 2, the alignment plate 31 to which the barrel 42 is fixed is coupled to the base plate 10 by the alignment plate alignment member 38. The alignment plate alignment member 38 may control a direction of the barrel 42 such that the extending direction of the barrel 42 fixed to the alignment plate 31 is parallel to a path of light radiated from the light source unit 20.

In this case, the alignment plate alignment member 38 does not control vertical or lateral movement of the alignment plate 31, and this is because relative movement of the alignment plate 31 can be controlled by controlling vertical or lateral movement of the light source unit 20.

In order to control the direction of the barrel 42 coupled to the alignment plate 31, the alignment plate alignment member 38 may rotate the alignment plate 31 about a sixth axis extending in the lateral direction and a seventh axis extending in the vertical direction as rotation axes.

In this case, the alignment plate alignment member 38 does not rotate the alignment plate 31 about an axis extending in a front-rear direction, and this is because the barrel 42 and the receiver board 46 can be aligned with each other by aligning the receiver board 46 which will be described below.

However, the alignment plate alignment member 38 controls the alignment plate 31 with a rotation center of the alignment plate 31 as a center point of the optical stop area of the barrel 42. Through such control, after the alignment plate 31 is aligned, the LiDAR receiver can be manufactured simply by aligning the receiver board 46 without modifying an optical path between the alignment plate 31 and the light source unit 20, which enables a viewing angle check operation which will be described below.

As shown in FIG. 2, after the alignment plate 31 and the barrel 42 are aligned by the alignment plate alignment member 38, the receiver board 46 including the light detection element 48 provided at an end portion thereof in front of the aligned barrel 42 is aligned. To this end, the receiver board 46 is fixed to the alignment plate 31 by the receiver board fixing member 34 as shown in FIG. 3. In this case, the receiver board fixing member 34 supports a front surface of the receiver board 46 in a state in which the light detection element 48 of the receiver board 46 is disposed to face rearward.

As shown in FIG. 3, the receiver board alignment member 36 for coupling the receiver board alignment member 36 and the alignment plate 31 is disposed in front of the receiver board fixing member 34. The receiver board alignment member 36 controls movement of the receiver board 46 such that the receiver board 46 may be aligned with the barrel 42.

In order to align the receiver board 46 with the barrel 42, the receiver board alignment member 36 may rotate the receiver board fixing member 34 about a second axis extending in the vertical direction and a fourth axis extending in the lateral direction as rotation axes.

Thus, as shown in FIG. 6B, when light radiated from the light-emitting module 22 to pass through the barrel 42 does not reach the center of the light detection element 48, the receiver board fixing member 34 may be rotated about the second axis or the fourth axis to allow light to be placed at the center of the light detection element 48 as shown in FIG. 6C.

In particular, the receiver board alignment member 36 may rotate the receiver board fixing member 34 about a fifth axis extending in the vertical direction as a rotation axis. In this case, as shown in FIG. 6A, when the light detection element 48 of the receiver board 46 is not disposed perpendicular to a ground surface, the receiver board fixing member 34 is also rotated about the fifth axis to allow light to be placed at the center of the light detection element 48.

Meanwhile, the receiver board alignment member 36 may control the receiver board fixing member 34 to move forward or rearward along the fifth axis. Thus, when sensitivity of the light detection element 48 is low because an image from light passing through the barrel 42 and reaching the light detection element 48 is not formed well on the light detection element 48, the light detection element 48 may be moved forward or rearward to adjust a focus.

In addition, in a state in which the receiver board fixing member 34 is moved forward or rearward along the fifth axis, the receiver board alignment member 36 couples and integrally forms the receiver board 46 and the barrel 42, so that a LiDAR receiver that is integrated with the barrel 42 and is not misaligned can be manufactured. In this case, as a method of coupling the receiver board 46 to the barrel 42, a known method such as a chemical bonding or screw coupling method may be used, but the present disclosure is not limited thereto.

Figure 9:
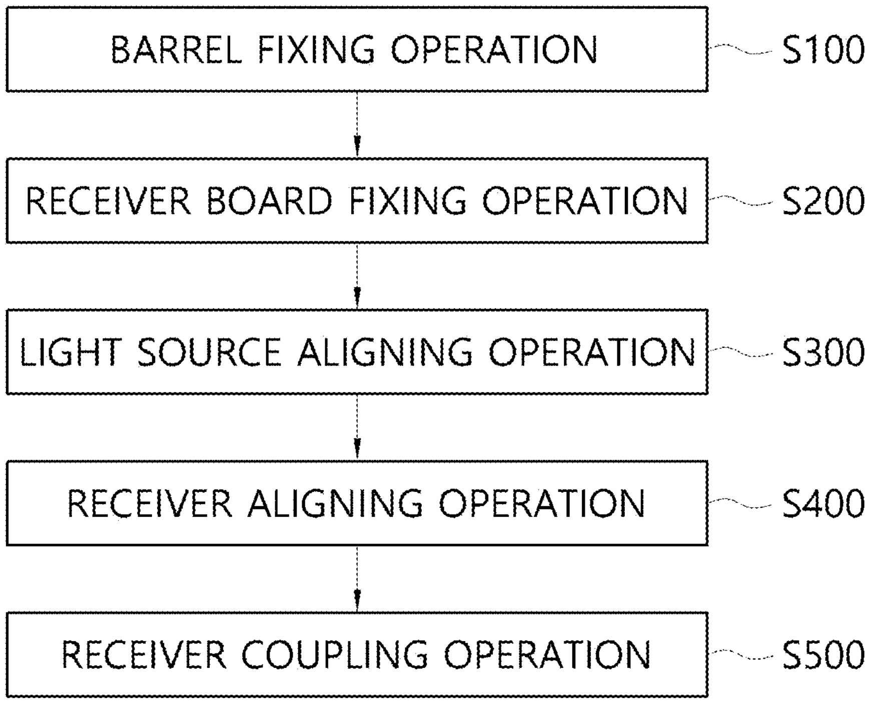
FIG. 9 is a flowchart illustrating a method of manufacturing a LiDAR receiver according to one embodiment of the present disclosure.
Figure 10:
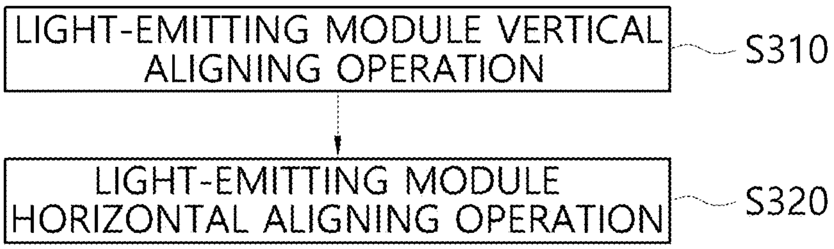
FIG. 10 is a flowchart illustrating a light source aligning operation of the method of manufacturing a LiDAR receiver according to one embodiment of the present disclosure.
Figure 11:
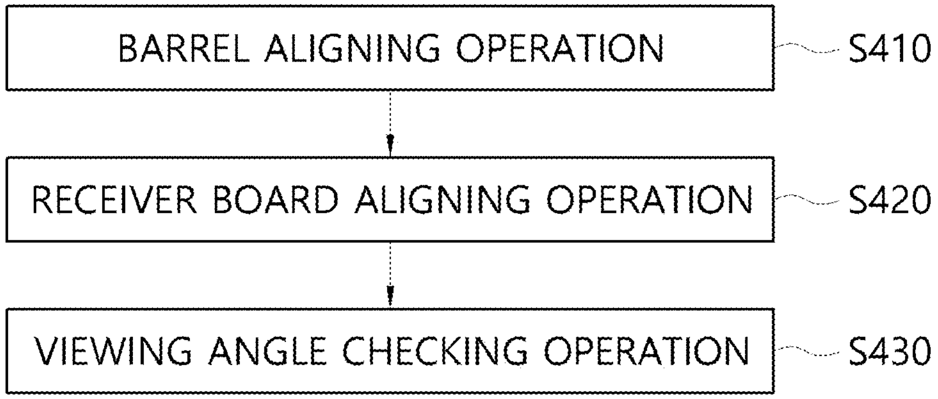
FIG. 11 is a flowchart illustrating a receiver board aligning operation of the method of manufacturing a LiDAR receiver according to one embodiment of the present disclosure.
Figure 12:
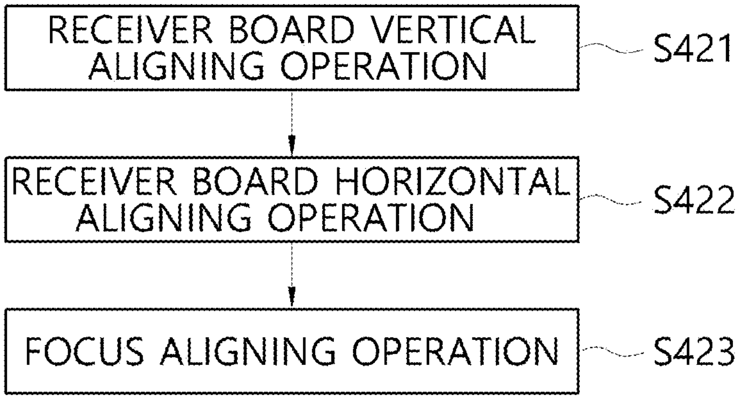
FIG. 12 is a flowchart illustrating a receiver board aligning operation of the method of manufacturing a LiDAR receiver according to one embodiment of the present disclosure.
Figure 13:
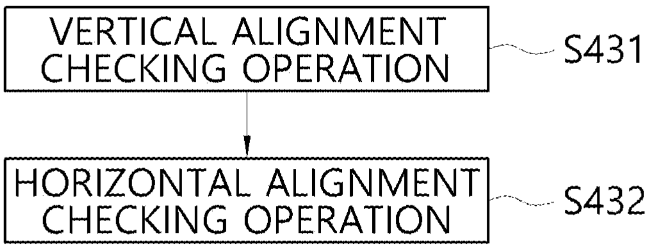
FIG. 13 is a flowchart illustrating a viewing angle checking operation of the method of manufacturing a LiDAR receiver according to one embodiment of the present disclosure.

FIG. 9 is a flowchart illustrating a method of manufacturing a LiDAR receiver according to one embodiment of the present disclosure. FIG. 10 is a flowchart illustrating a light source aligning operation of the method of manufacturing a LiDAR receiver according to one embodiment of the present disclosure. FIG. 11 is a flowchart illustrating a receiver board aligning operation of the method of manufacturing a LiDAR receiver according to one embodiment of the present disclosure. FIG. 12 is a flowchart illustrating a receiver board aligning operation of the method of manufacturing a LiDAR receiver according to one embodiment of the present disclosure. FIG. 13 is a flowchart illustrating a viewing angle checking operation of the method of manufacturing a LiDAR receiver according to one embodiment of the present disclosure.

The method of manufacturing a LiDAR receiver using an apparatus 1 for manufacturing a LiDAR receiver according to one embodiment of the present disclosure includes a barrel fixing operation S100, a receiver board fixing operation S200, a light source aligning operation S300, a receiver aligning operation S400, and a receiver coupling operation S500. Hereinafter, descriptions overlapping the descriptions of the apparatus 1 for manufacturing a LiDAR receiver will be omitted.

As shown in FIGS. 2 and 9, in the barrel fixing operation S100, a barrel 42 is fixed to a barrel fixing member 32 such that a lens 44 faces rearward. In this case, when the barrel 42 is fixed to the barrel fixing member 32, a length direction of the barrel 42 is disposed parallel to a length direction of a base plate 10.

As shown in FIGS. 2 and 9, in the receiver board fixing operation S200, a receiver board 46 having a rear surface on which a plurality of light detection elements 48 are disposed is fixed to a receiver board fixing member 34 such that the plurality of light detection elements 48, which are vertically disposed in a line on a receiver board fixing member 34 positioned in front of the barrel 42, face the barrel 42.

As shown in FIGS. 3 and 9, in the light source aligning operation S300, light radiated from a light-emitting module 22 including a light-emitting element 23 is disposed to travel toward the lens 44.

In this case, the light source aligning operation S300 includes a light-emitting module vertical aligning operation S310 and a light-emitting module horizontal aligning operation S320.

As shown in FIGS. 3, 9, and 10, in the light-emitting module vertical aligning operation S310, through a light-emitting module alignment member 26 disposed between a light-emitting module fixing member and the base plate 10, a movement path of light of the light-emitting module 22 is controlled and shifted along a first axis extending in a lateral direction.

In this case, in the light-emitting module vertical aligning operation S310, the movement path of the light may be controlled and rotated about the first axis extending in the lateral direction to be parallel to the base plate 10.

As shown in FIGS. 4, 9, and 10, in the light-emitting module horizontal aligning operation S320, the movement path of the light of the light-emitting module 22 is controlled and shifted along a third axis extending in a vertical direction.

In the receiver aligning operation S400 shown in FIG. 9, a movement path of light is aligned such that the light reaches the light detection element 48 to be perpendicular thereto.

Referring to FIGS. 9 and 11, the receiver aligning operation S400 of the method of manufacturing a LiDAR receiver using the apparatus 1 for manufacturing a LiDAR receiver according to one embodiment of the present disclosure includes a barrel aligning operation S410 and a receiver board aligning operation S420.

In the receiver board aligning operation S420, through a receiver board alignment member 36 for connecting the receiver board fixing member 34 to an alignment plate 31, the receiver board 46 is aligned to align a movement path of light irradiated from the light-emitting element 23 with the light detection element 48 of the receiver board 46.

In the receiver aligning operation S400, in order for an extending direction in which the barrel 42 extends forward to be parallel to a path of light emitted from the light-emitting element 23, the alignment plate 31 is controlled through an alignment plate alignment member 38 to be rotatable about a sixth axis extending in the lateral direction and a seventh axis extending in the vertical direction as rotation axes.

In this case, the receiver board aligning operation S420 of the method of manufacturing a LiDAR receiver using the apparatus 1 for manufacturing a LiDAR receiver according to one embodiment of the present disclosure includes a receiver board vertical aligning operation S421, a receiver board horizontal aligning operation S422, and a focus aligning operation S423.

As shown in FIGS. 3, 9, and 12, in the receiver board vertical aligning operation S421, through the receiver board alignment member 36, the receiver board 46 is controlled to be movable along a second axis extending in the vertical direction or to be rotatable about a fourth axis extending in the lateral direction or a fifth axis extending in a front-rear direction.

As shown in FIGS. 4, 9, and 12, in the receiver board horizontal aligning operation S422, through the receiver board alignment member 36, the receiver board 46 is controlled to be movable along the fourth axis extending in the lateral direction or to be rotatable about the second axis extending in the vertical direction.

As shown in FIGS. 5, 9, and 12, in the focus aligning operation S423, through the receiver board alignment member 36, the receiver board 46 is controlled to be movable along the fifth axis extending in the front-rear direction.

Therefore, as shown in FIGS. 9 and 11, the method of manufacturing a LiDAR receiver using the apparatus 1 for manufacturing a LiDAR receiver according to one embodiment of the present disclosure may further include a viewing angle checking operation S430 in the light detection element 48.

As shown in FIGS. 7 and 8, in the viewing angle checking operation S430, through an alignment plate alignment member 38 which may control the alignment plate 31 to be rotatable while the alignment plate 31 supports the barrel fixing member 32 to which the barrel 42 is fixed and the receiver board fixing member 34 to which the receiver board 46 is fixed, it is checked whether light reaches the light detection element 48 in a state in which a movement path of the light is aligned.

In the viewing angle checking operation S430, the alignment plate alignment member 38 controls the alignment plate 31 to rotate about a center point of an optical stop area of the lens 44 of the barrel 42.

The viewing angle checking operation S430 of the method of manufacturing a LiDAR receiver using the apparatus 1 for manufacturing a LiDAR receiver according to one embodiment of the present disclosure includes a vertical alignment checking operation S431 and a horizontal alignment checking operation S432.

As shown in FIGS. 7 and 13, in the vertical alignment checking operation S431, the alignment plate alignment member 38 may move the barrel 42 and the receiver board 46 together along a sixth axis extending in the lateral direction as a rotation axis. Accordingly, when an uppermost end of a viewing angle of a LiDAR receiver approaches the light-emitting element, a lowermost part of the light detection elements 48 arranged in a line detects light, and when a lowermost end of the viewing angle of the LiDAR receiver approaches the light-emitting element, an uppermost part of the light detection elements 48 arranged in a line detects light.

On the other hand, as shown in FIG. 7, the alignment plate alignment member 38 may move the barrel 42 and the receiver board 46 together along a seventh axis extending in the vertical direction as a rotation axis. Here, in the case of a 1D LiDAR, since a viewing angle is formed vertically and is not formed laterally, when the barrel 42 and the receiver board 46 are rotated about the seventh axis through the alignment plate alignment member 38, the light detection element 48 does not detect light.

Through such processes, it is possible to check whether the barrel 42 and the receiver board 46 are correctly aligned. When an unexpected result is obtained in the vertical alignment checking operation S431 or horizontal alignment checking operation S432, the receiver board 46 and the barrel 42 are aligned through the above operations again.

As shown in FIG. 9, in the receiver coupling operation S500, the receiver board 46 is coupled to a rear side of the barrel 42 in a state in which the receiver board 46 and the barrel 42 are aligned through the above operations.

Although an apparatus for manufacturing a LiDAR receiver and a method of manufacturing a LiDAR receiver according to various embodiments of the present disclosure have been described, one of ordinary skill in the art may clearly understand that the method of manufacturing a LiDAR receiver according to the present embodiment can be not only applied to align a receiver board and a barrel of a LiDAR receiver but can also be used as a device of which an optical path should be properly controlled.

In an apparatus for manufacturing a LiDAR receiver and a method of manufacturing a LiDAR receiver according to one embodiment of the present disclosure, a receiver and a lens are fixed integrally to a barrel to be optically aligned with each other, so that optical alignment can be constantly maintained after a LiDAR sensor is manufactured.

In addition, in an apparatus for manufacturing a LiDAR receiver and a method of manufacturing a LiDAR receiver according to one embodiment of the present disclosure, by providing a structure capable of rotating a barrel including a lens and a receiver board together, it is possible to check a viewing angle of a LiDAR sensor even in a small space when the LiDAR sensor is manufactured.

The effects of the present disclosure are not limited to the above effects and should be understood to include all effects that may be deduced from the detailed description of the present disclosure or the configuration of the present disclosure described in the appended claims.

Exemplary embodiments according to the present disclosure have been described above, and it is self-evident to those of ordinary skill in the art that, in addition to the above-described embodiments, the present disclosure may be embodied in other specific forms without departing from the gist or scope thereof. Thus, the above-described embodiments should be considered as being illustrative instead of limitative, and accordingly, the present disclosure is not limited to the above description and may be modified within the scope of the attached claims and their equivalents.

What is claimed is:

1. A method of manufacturing a light detection and ranging (LiDAR) receiver, the method comprising:

a barrel fixing operation of fixing a barrel to a barrel fixing member disposed at one side of a base plate such that a lens faces rearward;

a receiver board fixing operation of fixing a receiver board having one surface on which a plurality of light detection elements are disposed to a receiver board fixing member such that the plurality of light detection elements vertically disposed in a line on the receiver board fixing member disposed at a rear side of the barrel face the barrel;

a light source aligning operation of aligning a light source such that light emitted from a light-emitting module including a light-emitting element travels toward the lens;

a receiver aligning operation of aligning a movement path of the light such that the light reaches the light detection element to be perpendicular thereto;

a receiver coupling operation of coupling the receiver board to the rear side of the barrel; and a viewing angle checking operation of, by an alignment plate alignment member configured to connect an alignment plate to the base plate, rotating about a center point of an optical stop area of the lens of the barrel.

2. The method of claim 1, wherein, in the barrel fixing operation, the barrel is fixed to the barrel fixing member such that a length direction of the barrel is parallel to a length direction of the base plate.

3. The method of claim 1, wherein the light source aligning operation includes:

a light-emitting module vertical aligning operation of, through a light-emitting module alignment member disposed between the base plate and a light-emitting module fixing member to which the light-emitting module is fixed, controlling the movement path of the light of the light-emitting module to be shiftable along an axis extending in a lateral direction to be parallel to the base plate or to be rotatable about the axis extending in the lateral direction; and a light-emitting module horizontal aligning operation of controlling the movement path of the light of the light-emitting module to be shifted along an axis extending in a vertical direction.

4. The method of claim 1, wherein the receiver aligning operation includes:

a barrel aligning operation of, through the alignment plate alignment member disposed between the base plate and the alignment plate to which the barrel fixing member is coupled, controlling the alignment plate to be rotatable about an axis extending in a lateral direction and an axis extending in a vertical direction as rotation axes such that an extending direction in which the barrel extends forward is parallel to a path of light radiated from the light-emitting element; and a receiver board aligning operation of, through a receiver board alignment member configured to connect the receiver board fixing member to the alignment plate, aligning the receiver board to align a movement path of the light radiated from the light-emitting element with the light detection element of the receiver board.

5. The method of claim 4, wherein the receiver board aligning operation includes;

a receiver board vertical aligning operation of, through the receiver board alignment board, controlling the receiver board to be movable along the axis extending in the vertical direction or to be rotatable about the axis extending in the lateral direction or a front-rear direction;

a receiver board horizontal aligning operation of, through the receiver board alignment board, controlling the receiver board to be movable along the axis extending in the lateral direction or to be rotatable about the axis extending in the vertical direction; and a focus aligning operation of, through the receiver board alignment member, controlling the receiver board to be movable along the axis extending in the front-rear direction.

6. The method of claim 1, wherein the viewing angle checking operation is performed by the alignment plate alignment member which controls the alignment plate to be rotatable such that the barrel rotates about the center point of the optical stop area of the lens of the barrel, wherein the alignment plate supports the barrel fixing member to which the barrel is fixed and the receiver board fixing member to which the receiver board is fixed, and the viewing angle checking operation comprises checking whether the light reaches the light detection element in a state in which the movement path of the light is aligned.

7. The method of claim 6, wherein the viewing angle checking operation includes:

a vertical alignment checking operation of rotating the alignment plate about an axis extending in a lateral direction and checking whether the plurality of light detection elements detect the light; and a horizontal alignment checking operation of rotating the alignment plate about an axis extending in a vertical direction and checking whether intensities of light detected by the plurality of light sensing elements are symmetrical.

8. An apparatus for manufacturing a light detection and ranging (LiDAR) receiver in which a receiver board is coupled integrally to a barrel having one side provided with a lens after the receiver board having one side on which a light detection element is mounted is aligned with the other side of the barrel, the apparatus comprising:

a base plate having a plate shape of which a length extends rearward;

a light source unit disposed at a rear side of an upper surface of the base plate; and a receiver alignment unit disposed to face the light source unit at a front side of the base plate, wherein:

the light source unit includes a light-emitting module including a light-emitting element configured to radiate light forward and a light-emitting module fixing member configured to fix the light-emitting module to the base plate; and a receiver alignment unit includes an alignment plate having a plate shape, a barrel fixing member configured to fix the barrel to a front side of the alignment plate, a receiver board fixing member configured to fix the receiver board to the alignment plate such that the receiver board is disposed at a rear side of the barrel;

a receiver board alignment member configured to couple the receiver board to the rear side of the barrel in a state in which the light reaches the light detection element to be perpendicular thereto; and the receiver alignment unit further includes an alignment plate alignment member configured to connect the alignment plate to the base plate and rotate about a center point of an optical stop area of the lens of the barrel.

9. The apparatus of claim 8, wherein the detection element is provided as a plurality of detection elements, and the plurality of detection elements are disposed in a line on one surface of the receiver board.

10. The apparatus of claim 8, wherein the barrel fixing member fixes the barrel such that a length direction of the barrel is parallel to a length direction of the base plate.

11. The apparatus of claim 8, wherein:

the light source unit further includes a light-emitting module alignment member disposed between the light-emitting module fixing member and the base plate to control a movement path of the light of the light-emitting module; and the light-emitting module alignment member controls the movement path of the light to be shiftable along a first axis extending in a lateral direction.

12. The apparatus of claim 11, wherein the receiver board alignment member is configured to connect the receiver board fixing member to the alignment plate and control the receiver board to be rotatable about a second axis extending in a vertical direction as a rotation axis.

13. The apparatus of claim 8, further comprising a light-emitting module alignment member disposed between the light-emitting module fixing member and the base plate to control a movement path of the light of the light-emitting module, wherein the light-emitting module alignment member controls the movement path of the light to be rotatable about a first axis extending in a lateral direction to be parallel to the base plate.

14. The apparatus of claim 8, wherein:

the light source unit further includes a light-emitting module alignment member disposed between the light-emitting module fixing member and the base plate to control a movement path of the light of the light-emitting module; and the light-emitting module alignment member controls the movement path of the light to be shiftable along a third axis extending in a vertical direction.

15. The apparatus of claim 14, wherein the receiver board alignment member configured to connect the receiver board fixing member to the alignment plate and control the receiver board to be rotatable about a fourth axis extending in a lateral direction as a rotation axis.

16. The apparatus of claim 14, wherein the receiver board alignment member configured to connect the receiver board fixing member to the alignment plate and control the receiver board to be rotatable about a fifth axis extending in a front-rear direction as a rotation axis.

17. The apparatus of claim 14, wherein the receiver board alignment member configured to connect the receiver board fixing member to the alignment plate and control the receiver board to be movable along a fifth axis extending in a front-rear direction as a rotation axis.

18. The apparatus of claim 8, wherein the receiver alignment unit further includes an alignment plate alignment member configured to connect the alignment plate to the base plate and control the alignment plate to be rotatable about a sixth axis extending in a lateral direction as a rotation axis.

19. The apparatus of claim 8, wherein the receiver alignment unit further includes an alignment plate alignment member configured to connect the alignment plate to the base plate and control the alignment plate to be rotatable about a seventh axis extending in a vertical direction as a rotation axis.

* * * * *